United States Patent
Miura et al.

(10) Patent No.: US 7,924,034 B2
(45) Date of Patent: Apr. 12, 2011

(54) ELECTRIC CONNECTING APPARATUS

(75) Inventors: Kiyotoshi Miura, Hirakawa (JP);
Hitoshi Sato, Minamitsugaru-gun (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 220 days.

(21) Appl. No.: 12/300,784

(22) PCT Filed: Jun. 2, 2006

(86) PCT No.: PCT/JP2006/311570
§ 371 (c)(1),
(2), (4) Date: Nov. 13, 2008

(87) PCT Pub. No.: WO2007/141867
PCT Pub. Date: Dec. 13, 2007

(65) Prior Publication Data
US 2009/0160469 A1    Jun. 25, 2009

(51) Int. Cl.
*G01R 31/02* (2006.01)
(52) U.S. Cl. ..................... 324/754; 324/758
(58) Field of Classification Search .......... None
See application file for complete search history.

(56) References Cited

U.S. PATENT DOCUMENTS
7,075,319 B2 *  7/2006 Mori ..................... 324/754

FOREIGN PATENT DOCUMENTS
| JP | 6180330 A | 6/1994 |
| JP | 7098330 A | 4/1995 |
| JP | 11-051972 | 2/1999 |
| JP | 2005069702 A | 3/2005 |
| WO | WO 2006126279 A1 | 11/2006 |
| WO | WO2006126279 A1 | 11/2006 |

* cited by examiner

*Primary Examiner* — Roberto Velez
(74) *Attorney, Agent, or Firm* — Ingrassia Fisher & Lorenz, P.C.

(57) ABSTRACT

In an electrical connecting apparatus, a thermal deformation restriction member, a reinforcing plate, and an auxiliary member are made of materials having smaller thermal expansion coefficients in this order, and a wiring board supporting a probe assembly is coupled with the reinforcing plate. The auxiliary member has a void inside the coupling region with the reinforcing plate. The void receives the deformed part when the center portion of the wiring board is deformed toward the reinforcing plate. Thus, the thermal deformation restriction member, the reinforcing plate, and the auxiliary member function as a three-layer bimetal having a sandwich structure, and the thermal deformation of the wiring board is restricted effectively.

8 Claims, 5 Drawing Sheets

ELECTRIC CONNECTING APPARATUS

TECHNICAL FIELD

The present invention relates to an electrical connecting apparatus used for electrical connection between a device under test such as an integrated circuit to be tested and a tester for performing an electrical test of the device under test.

BACKGROUND ART

As one of the electrical connecting apparatuses of this kind such as a probe card, there is one in which a probe assembly wherein a plurality of contactors or probes are attached to the lower surface of a probe substrate is attached to the lower surface of a wiring board, and in which a reinforcing plate is attached to the upper surface of the wiring board (Patent Document 1).

However, in the above conventional electrical connecting apparatus, when a device under test is tested under a high-temperature environment condition such as that in a burn-in test, the electrical connecting apparatus itself is exposed to the high temperature, and the electrical connecting apparatus, in particular, the wiring board is thermally deformed.

It is thought that the aforementioned thermal deformation of the wiring board occurs because, even when the wiring board thermally expands outward in the radius direction, the thermal expansion outward in the radius direction is prevented by an attachment base of a tester as the wiring board is undisplaceably attached to the attachment base of the tester at its circumferential portion, and the wiring board is significantly deflected and deformed in an arc in a state where the center portion of the wiring board is projected downward due to weight of the probe assembly attached to it.

When the center portion of the wiring board is deformed in the aforementioned manner, the height positions of the probes against the device under test vary, and moreover the variation amount differs per probe. Consequently, when the probes and the device under test are thrust relatively, some probes do not contact the device under test, and other probes do not contact it well, and an accurate test cannot be performed.

In order to restrict the aforementioned thermal deformation of the wiring board, the present applicant has invented a laminated electrical connecting apparatus in which a thermal deformation restriction member having a larger thermal expansion coefficient (easier to thermally expand) than that of the reinforcing plate is provided in addition to the reinforcing plate provided on the wiring board (PCT/JP2005/009812).

According to this novel electrical connecting apparatus, a bimetallic action is made on the reinforcing plate and the thermal deformation restriction member so that the thermal expansion outward in the radius direction and the thermal deformation downward of the wiring board are restricted by the reinforcing plate and the thermal deformation restriction member, and the deflection deformation of the center portion of the wiring board under the high-temperature environment can be restricted.

However, in the above novel laminated electrical connecting apparatus, just providing the thermal deformation restriction member restricts the deflection deformation of the center portion of the wiring board to a certain extent at the time of a test under the high-temperature environment condition but does not restrict it to the extent that difference in thrusting force or probe pressure acting between the device under test and the probes is within an allowable range.

Patent Document 1: Japanese Unexamined Patent Publication No. 11-51972

DISCLOSURE OF THE INVENTION

Problems to be Solved by the Invention

It is an object of the present invention to restrict thermal deformation of a wiring board further effectively.

Means to Solve the Problems

An electrical connecting apparatus according to the present invention comprises a wiring board, a probe assembly arranged on one surface side of the wiring board and having a plurality of probes attached to one surface of a probe substrate, a reinforcing plate having an attachment portion and coupled with the wiring board at the attachment portion to be spaced from the wiring board in its thickness direction in a state where its one surface is opposed to the other surface of the wiring board, a thermal deformation restriction member coupled with the other surface of the reinforcing plate, and an auxiliary member arranged between the wiring board and the reinforcing plate and coupled with the reinforcing plate. The thermal expansion coefficient of the reinforcing plate is smaller than that of the thermal deformation restriction member and is larger than that of the auxiliary member. The auxiliary member has a void that receives the deformed part when the center portion of the wiring board is deformed toward the reinforcing plate inside the coupling region with the reinforcing plate.

The wiring board may be a circular board, and the attachment portion may be formed in a circular shape having a smaller outer dimension than the diameter dimension of the circular board so as to be spaced from a circumference of the circular board.

The reinforcing plate may have a plurality of beam portions extending outward in the radius direction from the attachment portion toward the circumference of the circular board.

The thermal deformation restriction member may be made of aluminum, the reinforcing plate may be made of stainless steel, and the auxiliary member may be made of a material whose thermal expansion coefficient is smaller than those of the thermal deformation restriction member and the reinforcing plate.

The reinforcing plate, the thermal deformation restriction member, and the auxiliary member may respectively have first, second, and third annular portions having identical diameter dimensions, the first annular portion may extend around the attachment portion and may be made integrally with the attachment portion, and the reinforcing plate may be coupled at the first annular portion with the second and third annular portions.

The first, second, and third annular portions may respectively have rectangular cross-sectional shapes forming at least parts of one surfaces and the other surfaces of the reinforcing plate, the thermal deformation restriction member, and the auxiliary member, and one surface and the other surface of the first annular portion may respectively be opposed to the other surface of the auxiliary member and one surface of the thermal deformation restriction member, and one surface of the third annular portion may be opposed to the other surface of the wiring board.

The thermal deformation restriction member and the auxiliary member may be circular or rectangular rings. Also, the void may be opened at least to a side of the wiring board.

Effect of the Invention

In the present invention, the thermal deformation restriction member, the reinforcing plate, and the auxiliary member function as a three-layer bimetal since their thermal expansion coefficients are smaller in this order. Thus, when the ambient temperature rises, the center portion of the wiring board is deformed toward the reinforcing plate due to deformation of the reinforcing plate along with thermal expansion of the thermal deformation restriction member, so that such deformed part can be received in the void of the auxiliary member.

Thus, the downward displacement at the center portion of the wiring board due to weight of the probe assembly attached to the center portion of the wiring board is compensated. As a result, the thermal deformation of the wiring board is restricted effectively.

If the circumferential portion of the wiring board is exposed when the wiring board is a circular board, and the attachment portion has a smaller outer dimension than the diameter dimension of the circular board so as to be spaced from a circumference of the circular board, connectors or connection pads for connection to a tester can be arranged at the exposed part.

When the reinforcing plate has a plurality of beam portions extending outward in the radius direction from the attachment portion toward the circumference of the circular board, thermal deformation at the circumferential portion of the wiring board sticking out from the attachment portion of the reinforcing plate is restricted by the beam portions.

When the reinforcing plate is coupled at the first annular portion with the second annular portion of the thermal deformation restriction member and the third annular portion of the auxiliary member, and the first, second, and third annular portions have identical outer dimensions, the thermal deformation at the center portion of the wiring board is restricted more effectively.

DESCRIPTION OF THE SYMBOLS

10 electrical connecting apparatus
12 wiring board
14 reinforcing plate
16 thermal deformation restriction member
18 auxiliary member
20 probe assembly
22 electrical connector
24 base ring
26 fixing ring
28 semiconductor wafer
34 void
44 probe substrate
46 probe
48 pogo pin block
50 pogo pin
52 and 54 opening
56 flange portion
14*a*, 16*a* and 18*a* annular portion
14*b* attachment portion
14*c* beam portions
14*d* support portion

BEST MODE FOR CARRYING OUT THE INVENTION

Referring to FIGS. 1 to 4, an electrical connecting apparatus 10 includes a circular flat-plate-shaped wiring board 12, an annular flat-plate-shaped reinforcing plate 14 attached to the center region on the upper surface of the wiring board 12 in a state of being spaced outward from the wiring board 14, an annular thermal deformation restriction member 16 attached to the upper surface of the reinforcing plate 12 to be piled thereon, an annular auxiliary member 18 arranged between the wiring board 12 and the reinforcing plate 14, a probe assembly 20 spaced downward from the lower surface of the wiring board 12, a flat-plate-shaped electrical connector 22 attached to the center on the lower surface of the wiring board 12, a base ring 24 housing the electrical connector 22, and a fixing ring 26 attaching the probe assembly 20 to the wiring board 12.

These parts 12 to 26 are integrally attached by plural screw members as described later and are used for connection between respective electrodes as connection terminals of flat-plate-shaped devices under test (not shown) such as multiple IC circuits formed in a semiconductor wafer 28 (refer to FIG. 2) and electrical circuits (not shown) of a tester for an electrical test of the devices under test, for example.

In the example shown in the figures, the reinforcing plate 14, the thermal deformation restriction member 16, and the auxiliary member 18 are formed in circular shapes having mutually identical outer dimensions. However, these parts 14, 16, and 18 may be formed in rectangular shapes. The reinforcing plate 14, the thermal deformation restriction member 16, and the auxiliary member 18 are made to have smaller outer dimensions than that of the wiring board 12.

The wiring board 12 is made of an electrically insulating resin material such as polyimide resin entirely in a disk shape. The lower surface of the wiring board 12 is used as a flat attachment reference plane for the probe assembly 20 to be attached thereto.

Figure 1:
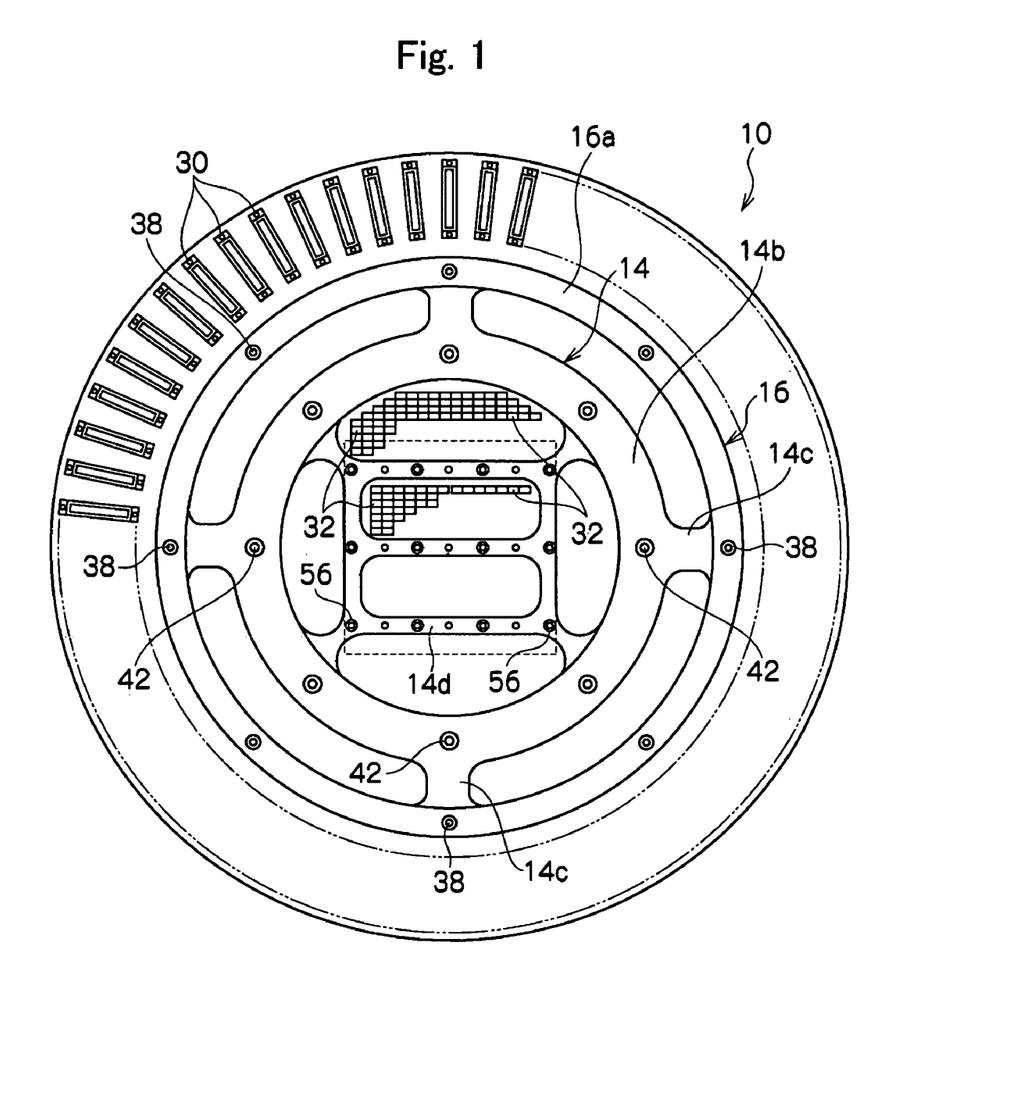
FIG. 1 is a plan view showing one embodiment of an electrical connecting apparatus according to the present invention.

At the circumferential portion on the upper surface of the wiring board 12 are arranged to be annularly arrayed multiple connectors 30 to be connected to the electrical circuits of the tester as shown in FIG. 1. Instead of such connectors, tester lands may be provided.

At the center portion on the lower surface of the wiring board 12 are arranged multiple connection terminals (not shown) in a rectangular matrix form. Each connection terminal is electrically connected to a terminal of the connector 30 via at least one of plural relays 32 provided at the center portion on the upper surface of the wiring board 12 by a wiring circuit (not shown) provided in the wiring board 12.

Each relay 32 is used to switch a connection terminal to a connection terminal that should be connected to the terminal of the connector 30 or to interrupt the wiring circuit in an emergency.

The reinforcing plate 14 is a frame member that allows the connectors 30 and the relays 32 to be exposed upward and is spaced upward from the wiring board 12 in a state where its lower surface is opposed to the upper surface of the wiring board 12.

The reinforcing plate 14 has an external annular portion 14a, an annular attachment portion 14b surrounding the relays 32 and extending inside the external annular portion 14a in the circumferential direction, and beam portions 14c integrally coupling the annular portion 14a with the attachment portion 14b.

In the example shown in the figures, the annular portion 14a forms the outer circumferential surface of the reinforcing plate 14 and extends outside the attachment portion 14b in the circumferential direction. Although the annular portion 14a and the attachment portion 14b are concentric rings in the example shown in the figures, they may be rectangular.

The reinforcing plate 14 also has a support portion 14d supporting the probe assembly 20 and the electrical connector 22 inside the attachment portion 14b so as to be integral with the attachment portion 14b. The annular portion 14a and the attachment portion 14b have rectangular cross-sectional shapes.

In the example shown in the figures, the thermal deformation restriction member 16 is made of an annular member arranged over the reinforcing plate 14 to cover the upper surface of the annular portion 14a of the reinforcing plate 14 and has a rectangular cross-sectional shape. Thus, the thermal deformation restriction member 16 functions as an annular portion 16a as a whole and also has an internal space 16a.

In the example shown in the figures, the auxiliary member 18 is also made of an annular member arranged under the reinforcing plate 14 to cover the lower surface of the annular portion 14a and has a rectangular cross-sectional shape. Thus, the auxiliary member 18 functions as an annular portion 18a as a whole.

An internal space of the auxiliary member 18 functions as a void 34 (refer to FIG. 4) that receives the thermally deformed part when the center portion of the wiring board 12 is deformed upward under a high-temperature environment. Accordingly, although the void 34 is opened to the upper and lower sides in the example shown in the figures, it may be opened only to the wiring board 12 side without being opened to the reinforcing plate 14 side.

The outer dimensions of the reinforcing plate 14, the thermal deformation restriction member 16, and the auxiliary member 18 are identical values smaller than that of the wiring board 12. Thus, the outer dimensions of the annular portions 14a, 16a, and 18a are identical. The reinforcing plate 14, the thermal deformation restriction member 16, and the auxiliary member 18 are concentrically coupled.

The reinforcing plate 14, the thermal deformation restriction member 16, and the auxiliary member 18 are made of materials so that the thermal expansion coefficient of the thermal deformation restriction member 16 is the largest, the thermal expansion coefficient of the reinforcing plate 14 is the second largest, and the thermal expansion coefficient of the auxiliary member 18 is the smallest.

For example, the reinforcing plate 14 may be made of stainless steel, the thermal deformation restriction member 16 may be made of aluminum whose thermal expansion coefficient is larger than that of the reinforcing plate 14, and the auxiliary member 18 may be made of a metal material, e.g., the trade name, Nobinite, whose thermal expansion coefficient is smaller than that of the reinforcing plate 14.

The reinforcing plate 14, the thermal deformation restriction member 16, and the auxiliary member 18 are assembled in a state where the upper and lower surfaces of their annular portions 14a, 16a, and 18a are opposed to and abut on one another by plural screw members 38 (refer to FIG. 1) penetrating the annular portions 14a, 16a, and 18a of the thermal deformation restriction member 16 and the reinforcing plate 14 in their thickness direction (up-down direction) and screwed in female screw holes 36 (refer to FIG. 4) of the annular portion 18a of the auxiliary member 18.

After the reinforcing plate 14, the thermal deformation restriction member 16, and the auxiliary member 18 have been assembled as above, the assembly is attached to the center portion on the upper surface of the wiring board 12 in a state where the lower surface of the auxiliary member 18 and the lower surface of the reinforcing plate 14 are opposed to the upper surface of the wiring board 12 by plural screw members 42 (refer to FIG. 1) penetrating the attachment portion 14b of the reinforcing plate 14 in the thickness direction and screwed in female screw holes 40 (refer to FIG. 4) of the wiring board 12.

The connectors 30 are arranged at parts of the wiring board 12 corresponding to the external sides of the reinforcing plate 14, the thermal deformation restriction member 16, and the auxiliary member 18 since the outer dimensions of the reinforcing plate 14, the thermal deformation restriction member 16, and the auxiliary member 18 are smaller than that of the wiring board 12, and moreover the reinforcing plate 14, the thermal deformation restriction member 16, and the auxiliary member 18 are located at the center part of the wiring board 12.

Figure 2:
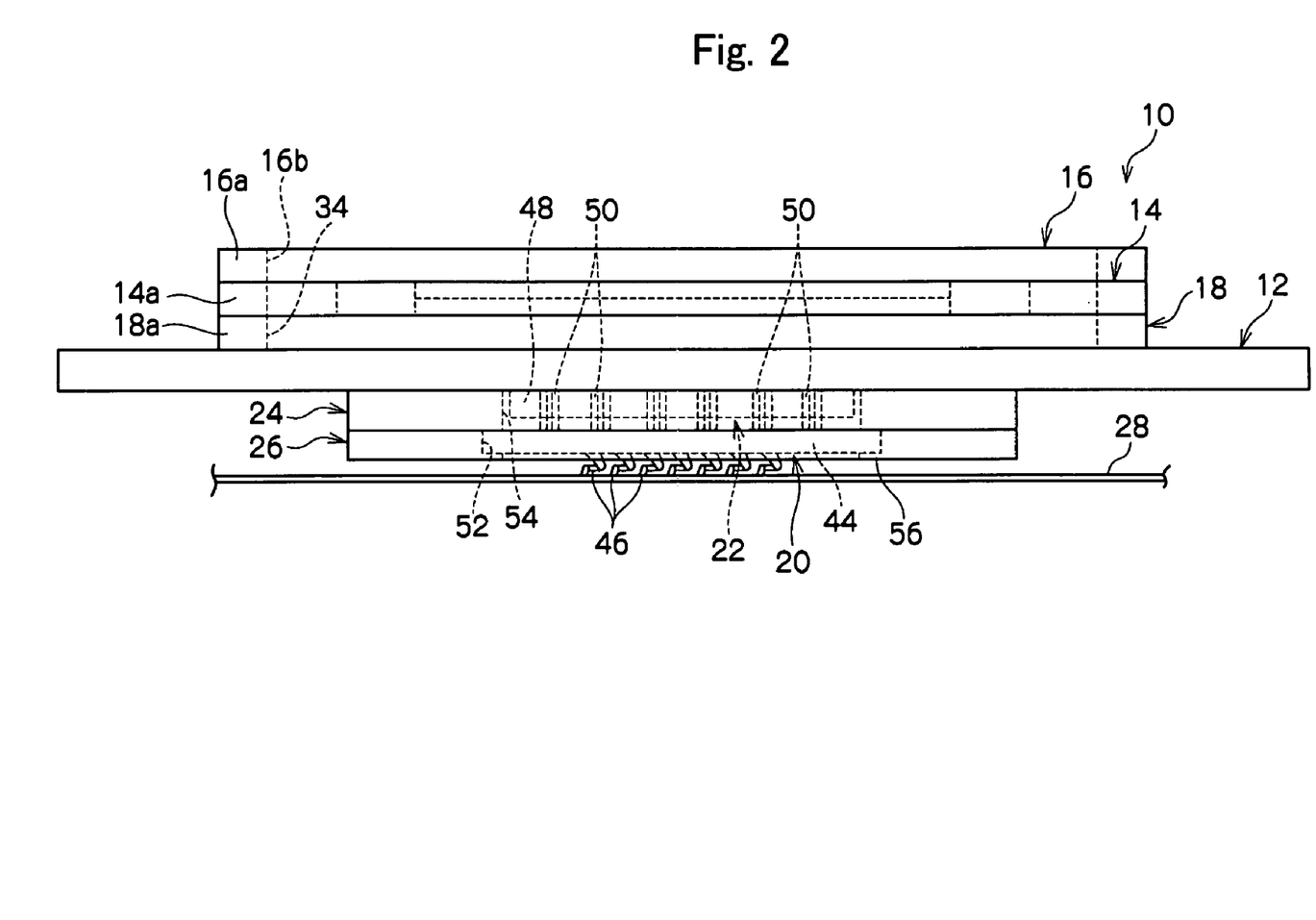
FIG. 2 is a front view of the electrical connecting apparatus shown in FIG. 1.
Figure 3:
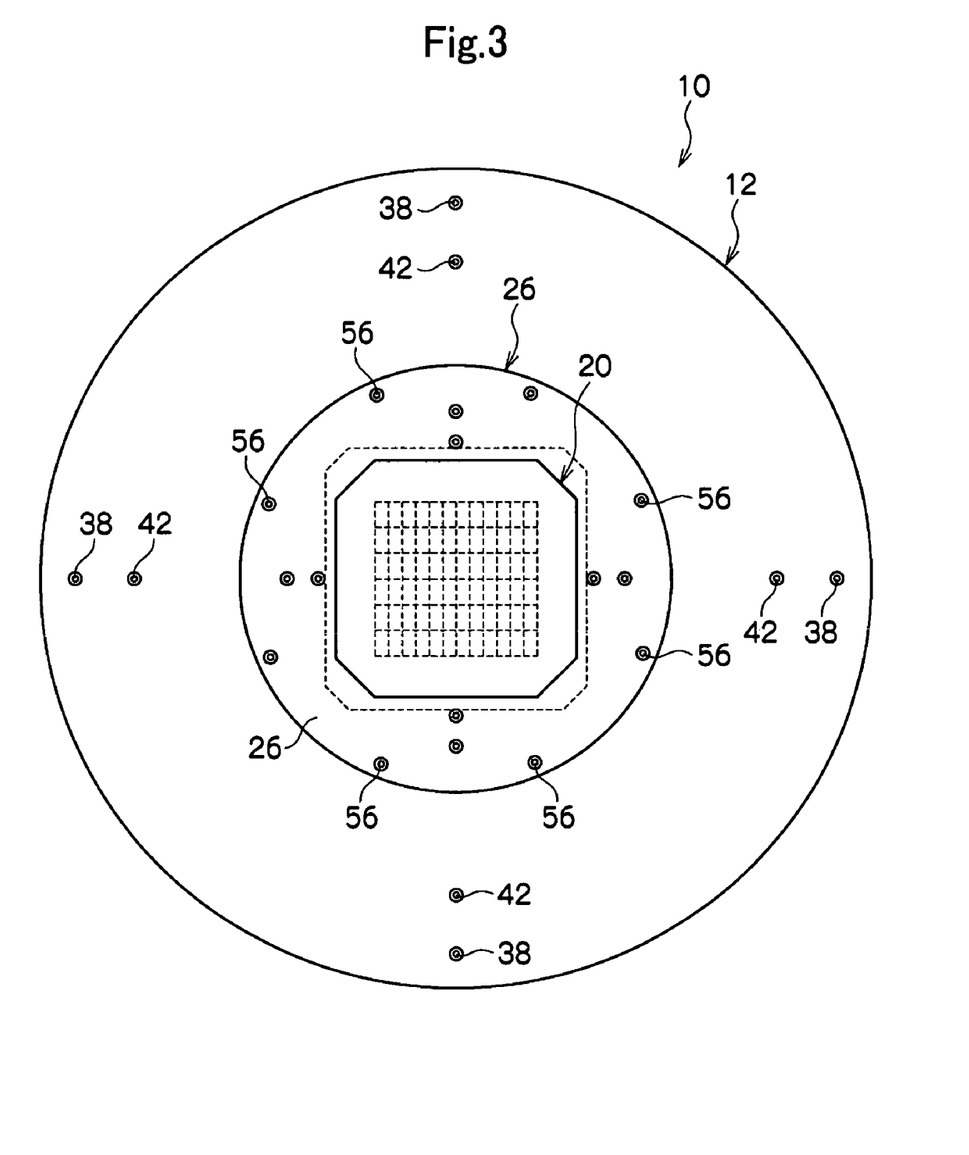
FIG. 3 is a bottom view of the electrical connecting apparatus shown in FIG. 1.
Figure 4:
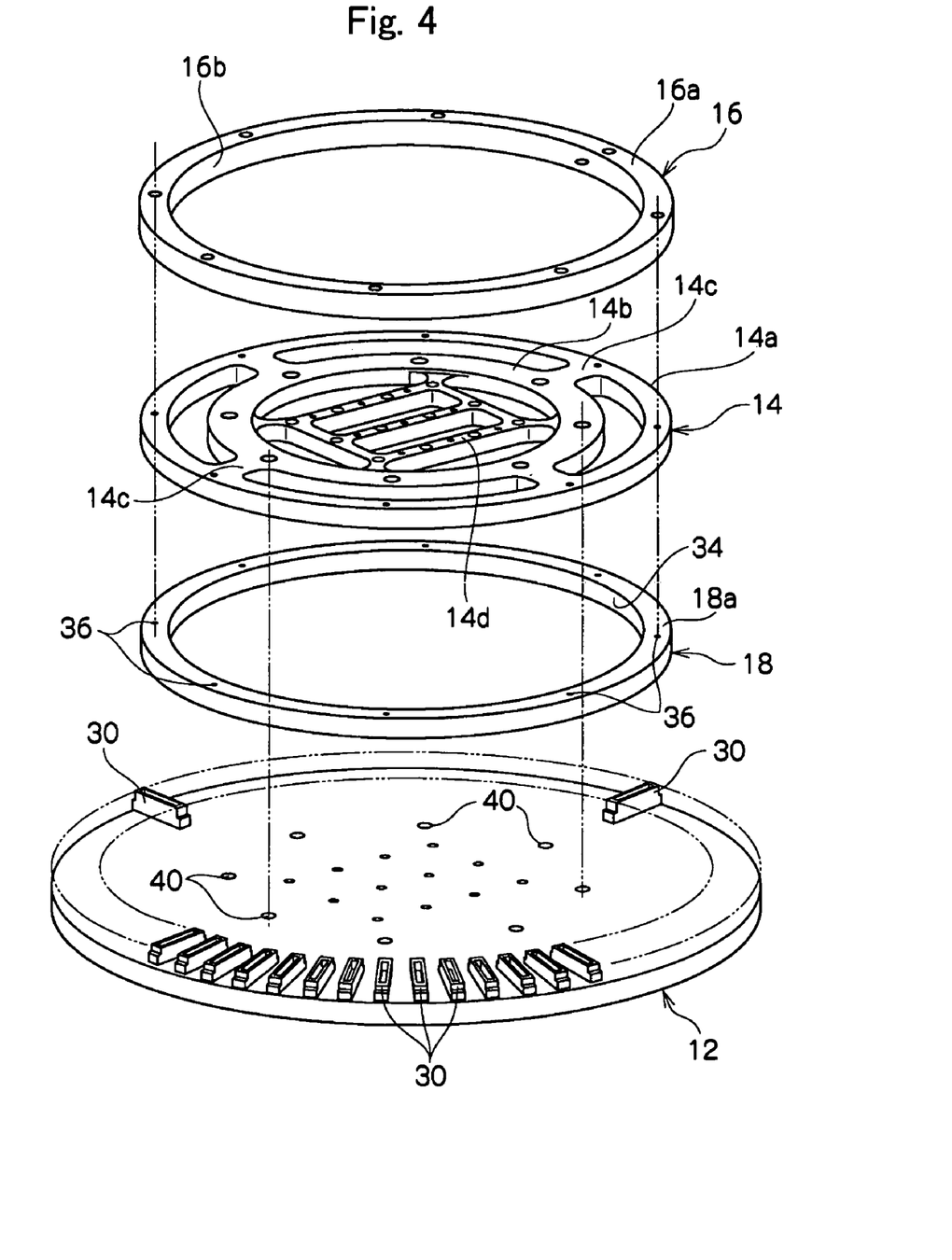
FIG. 4 is an exploded perspective view of main parts of the electrical connecting apparatus shown in FIG. 1.

The probe assembly 20 basically comprises a probe substrate 44 and multiple probes 46 provided on the lower surface of the probe substrate 44 (refer to FIG. 2). The probe substrate 44 comprises a substrate member (not shown) made of e.g., a ceramic plate and a multi-layered wiring layer (not shown) formed on the lower surface of this substrate member or the ceramic plate as is conventionally well known.

The aforementioned substrate member has plural wires electrically connected to wires of the aforementioned multi-layered wiring layer. Each wire of the substrate member is exposed on the upper and lower surfaces of the substrate member. The upper end of each wire of the substrate member is a connection land to the electrical connector 22 as described later, and the lower end is a connection portion to the wire of the multi-layered wiring layer as described later.

The aforementioned multi-layered wiring layer is made of e.g., a polyimide resin material with electrical insulation as is conventionally well known. The multi-layered wiring layer has plural wires exposed on its upper and lower surfaces. The lower end of each wire of the multi-layered wiring layer is a probe land electrically connected to the probe 46, and the upper end of each wire of the multi-layered wiring layer is an electrical connection portion to the wire of the aforementioned substrate member.

Each probe 46 corresponds to an electrode of the device under test in one-to-one relationship and is formed on the probe land of the wire of the multi-layered wiring layer in a state of projecting downward from the lower surface, which is the surface of the multi-layered wiring layer.

The electrical connector 22 comprises a pogo pin block 48 made of an electrically insulating plate-shaped member and pogo pins 50 respectively arranged in series in multiple through holes (not shown) penetrating this pogo pin block 48 in its thickness direction in the example shown in the figures (refer to FIG. 2). Each pogo pin 50 is prevented from dropping from the corresponding through hole of the pogo pin block 48.

The upper end of each pogo pin 50 contacts and is electrically connected to the connection terminal on the lower surface of the wiring board 12, and the lower end contacts and is electrically connected to the connection land of the probe substrate 44.

The fixing ring 26 and the base ring 24 respectively have center openings 52 and 54 (refer to FIG. 2) housing the probe substrate 20 and the electrical connector 22. The fixing ring 26 also has an inward flange portion 56 (refer to FIG. 2) that prevents the probe substrate 44 arranged in the center opening 52 from dropping.

The probe assembly 20 and the electrical connector 22 are attached and supported to the reinforcing plate 14 by plural screw members 56 (refer to FIG. 1) penetrating the probe assembly 20, the electrical connector 22, and the wiring board 12 in their thickness direction and screwed in female screw holes provided in the support portion 14d of the reinforcing plate 14 in a state of being housed in the openings 52 and 54 of the fixing ring 26 and the base ring 24.

Attachment of the probe assembly 20 and the electrical connector 22 to the reinforcing plate 14 may be done separately from coupling of the wiring board 12, the reinforcing plate 14, the thermal deformation restriction member 16, and the auxiliary member 18.

In the assembling state as above, the probe substrate 44 is held at its circumferential portion by the flange portion 56 of the fixing ring 26 and the edge portion around the center opening of the base ring 24. Also, each probe 46 is electrically connected to the terminal of the connector 30 via the wire of the probe substrate 44, the pogo pin 50 of the electrical connector 22, the wiring circuit of the wiring board 12, and the relay 32.

Figure 5:
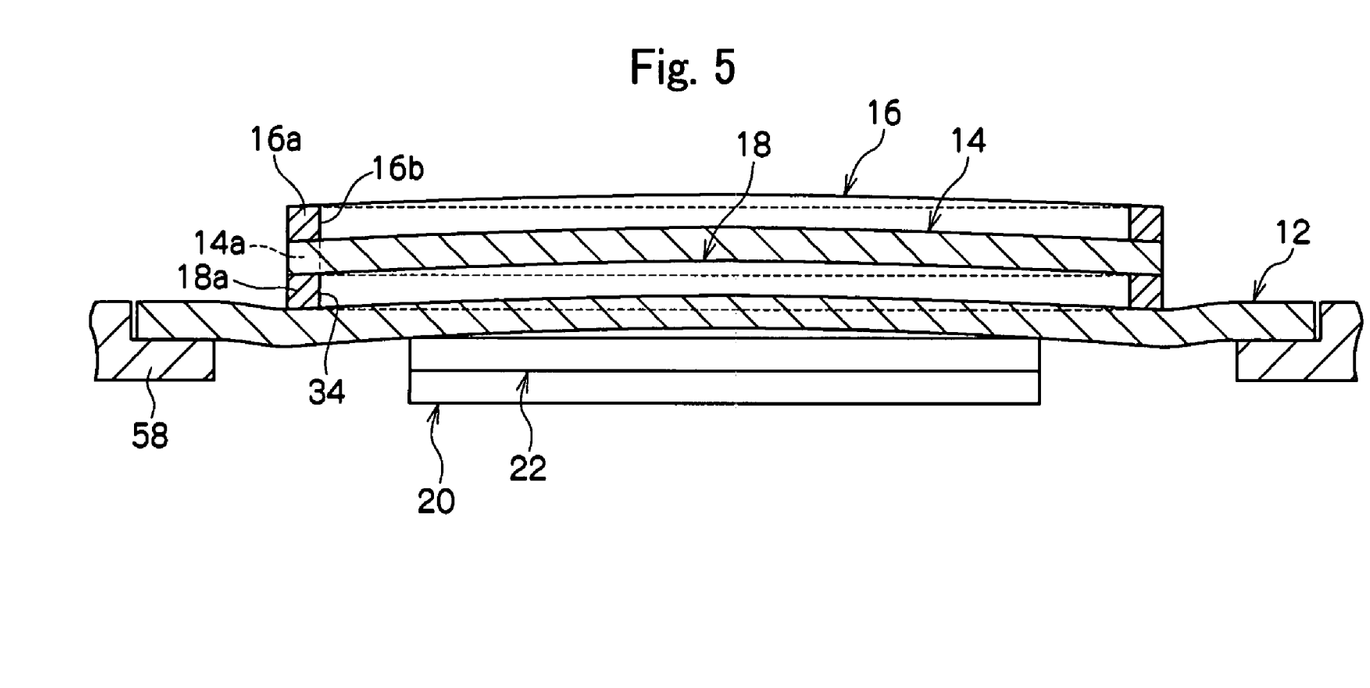
FIG. 5 schematically shows a thermal deformation state.

As shown in FIG. 5, the electrical connecting apparatus 10 is undisplaceably attached to an attachment base 58 of the tester at the circumferential portion of the wiring board 12 by plural screw members so that the probe assembly 20 is on the lower side, and the thermal deformation restriction member 16 is on the upper side.

The electrical connecting apparatus 10 is connected to the electrical circuits of the tester via the connectors 30 in a state of being attached to the attachment base 58 of the tester. An electrical test of the device under test is performed in a state where each electrode of the device under test and the tip end (probe tip) of the corresponding probe 46 are relatively thrust.

When the electrical test is performed under a high-temperature atmosphere such as in the case of a burn-in test, in the electrical connecting apparatus 10, the thermal deformation restriction member 16, the reinforcing plate 14, and the auxiliary member 18 function as a three-layer bimetal that makes the center portion of the reinforcing plate 14 swell upward since the thermal expansion coefficients of the thermal deformation restriction member 16, the reinforcing plate 14, and the auxiliary member 18 are smaller in this order, and since these parts 14, 16, and 18 are coupled with one another.

The center portion of the wiring board 12 is deformed downward due to weight of the probe assembly 20 attached to the center portion of the wiring board 12 when the ambient temperature rises.

However, since the thermal deformation restriction member 16 deformed upward is prevented from expanding in the radius direction by the reinforcing plate 14, it is deformed so as to displace the center portion (region inside the annular portion 14a) of the reinforcing plate 14 upward. Accordingly, the deformation force acting on the reinforcing plate 14 caused by the thermal deformation of the thermal deformation restriction member 16 deforms the center portion of the reinforcing plate 14 upward and acts on the wiring board 12 as a force that deforms the center portion of the wiring board 12 toward the reinforcing plate 14.

The aforementioned upward-deformed part at the center portion of the wiring board 12 is received in the void 34 of the auxiliary member 18. Thus, the downward displacement at the center portion of the wiring board 12 due to weight of the probe assembly 20 attached to the center portion of the wiring board 12 is compensated. As a result, the thermal deformation of the wiring board is restricted effectively.

It is inferred that the above thermal deformation restriction effect by the bimetallic action of the three-layer structure results from the following reasons.

Under the high-temperature environment condition, as the wiring board 12 is undisplaceably attached to the attachment portion 58 (refer to FIG. 5) of the tester, its thermal expansion in the radius direction is prevented, and its center portion is about to do hemispherical deflection deformation in a state of projecting downward due to weight of the probe assembly 20.

On the other hand, as the thermal deformation restriction member 16 is undisplaceably attached to the reinforcing plate 14, its thermal expansion in the radius direction is prevented, and the inner region of its coupling region with the reinforcing plate 14 is prevented from swelling to the reinforcing plate 14 side by the reinforcing plate 14. Thus, a deformation force that makes the inner region of the coupling region with the reinforcing plate 14 swell to a side opposite the reinforcing plate 14 side occurs in the thermal deformation restriction member 16. This deformation force deforms the center portion of the wiring board 12 to the reinforcing plate 14 side via the center portion of the reinforcing plate 14, that is, lifts it up.

At this time, if the auxiliary member 18 does not exist, the center portion of the wiring board 12 is prevented from being deformed to the reinforcing plate 14 side by the reinforcing plate 14 itself, and thus an effect of restricting the thermal deformation at the center portion of the wiring board 12 to the extent that difference in thrusting force or probe pressure acting between the device under test and the probes 46 is within an allowable range does not occur.

However, when the aforementioned auxiliary member 18 exists between the wiring board 12 and the reinforcing plate 14, the center portion of the wiring board 12 goes or is lifted up in the void 34 of the auxiliary member 18 due to the deformation force along with the thermal expansion of the thermal deformation restriction member 16 and the lifting effect on the center portion of the reinforcing plate 14 by the thermal deformation restriction member 16. Accordingly, the thermal deformation at the center portion of the wiring board 12 is restricted to the extent that difference in probe pressure is within an allowable range, and the thermal deformation of the wiring board 12 is restricted effectively.

The thermal deformation state of the wiring board 12 under the high-temperature environment is schematically shown in FIG. 5. Although the center portion of the flat wiring board 12 is deformed downward due to weight of the probe assembly 20 along with increase of the ambient temperature as shown by the dotted line, it is lifted upward as a result of upward deformation at the center portions of the reinforcing plate 14, the thermal deformation restriction member 16, and the auxiliary member 18 (shown by the solid lines) and is received in the void 34 of the auxiliary member 18 as shown by the solid line.

INDUSTRIAL APPLICABILITY

The present invention is not limited to the above embodiments but may be altered in various ways without departing from the spirit and scope of claims of the present invention.

What is claimed is:

1. An electrical connecting apparatus comprising: a wiring board having an upper surface side and a lower surface side; a probe assembly arranged on one surface side of said wiring board and having a probe substrate and a plurality of probes attached to a lower surface side of said probe substrate; a reinforcing plate having an upper surface side, a lower surface side, and an attachment portion and coupled with said wiring board at said attachment portion to be spaced from said wiring board in a thickness direction of said wiring board in a state where the lower surface side of said reinforcing plate is opposed to the upper surface side of said wiring board; a thermal deformation restriction member having an upper surface side and a lower surface side and coupled with the upper surface side of said reinforcing plate; and an auxiliary member having an upper surface side and a lower surface side and arranged between said wiring board and said reinforcing plate and coupled with said reinforcing plate, wherein a thermal expansion coefficient of said reinforcing plate is smaller than that of said thermal deformation restriction member and is larger than that of said auxiliary member, and said auxiliary member has a void inside a coupling region with said reinforcing plate, said void receiving a deformed part when a center portion of said wiring board is deformed toward said reinforcing plate.

2. The electrical connecting apparatus according to claim 1, wherein said wiring board is a circular board, and said attachment portion is formed in a circular shape having a smaller outer dimension than a diameter dimension of said circular board so as to be spaced from a circumference of said circular board.

3. The electrical connecting apparatus according to claim 2, wherein said reinforcing plate has a plurality of beam portions extending outward in a radius direction from said attachment portion toward said circumference of said circular board.

4. The electrical connecting apparatus according to claim 1, wherein said thermal deformation restriction member is made of aluminum, said reinforcing plate is made of stainless steel, and said auxiliary member is made of a material whose thermal expansion coefficient is smaller than those of said thermal deformation restriction member and said reinforcing plate.

5. The electrical connecting apparatus according to claim 1, wherein said reinforcing plate, said thermal deformation restriction member, and said auxiliary member respectively have first, second, and third annular portions having identical diameter dimensions, wherein said first annular portion extends around said attachment portion and is made integrally with said attachment portion, and wherein said reinforcing plate is coupled at said first annular portion with said second and third annular portions.

6. The electrical connecting apparatus according to claim 5, wherein said first, second, and third annular portions respectively have rectangular cross-sectional shapes forming at least parts of the upper surface side and the lower surface side of said reinforcing plate, said thermal deformation restriction member, and said auxiliary member, and wherein an upper surface side and a lower surface side of said first annular portion are respectively opposed to the upper surface side of said auxiliary member and the lower surface side of said thermal deformation restriction member, and a lower surface side of said third annular portion is opposed to the upper surface side of said wiring board.

7. The electrical connecting apparatus according to claim 1, wherein said thermal deformation restriction member and said auxiliary member are circular or rectangular rings.

8. The electrical connecting apparatus according to claim 1, wherein said void is opened at least to a side of said wiring board.

* * * * *